United States Patent
Davidson et al.

(10) Patent No.: US 10,310,003 B2
(45) Date of Patent: Jun. 4, 2019

(54) FAULT LOCATION IN DC NETWORKS

(71) Applicant: General Electric technology GmbH, Baden (CH)

(72) Inventors: Colin Davidson, Stafford (GB); David Reginald Trainer, Derby (GB); Carl Barker, Stone (GB); Oleg Bagleybter, Stafford (GB)

(73) Assignee: General Electric Technology GmbH (CH)

( * ) Notice: Subject to any disclaimer, the term of this patent is extended or adjusted under 35 U.S.C. 154(b) by 236 days.

(21) Appl. No.: 15/120,109

(22) PCT Filed: Feb. 18, 2015

(86) PCT No.: PCT/EP2015/053409
§ 371 (c)(1),
(2) Date: Aug. 18, 2016

(87) PCT Pub. No.: WO2015/124622
PCT Pub. Date: Aug. 27, 2015

(65) Prior Publication Data
US 2017/0074919 A1    Mar. 16, 2017

(30) Foreign Application Priority Data

Feb. 19, 2014 (EP) .................. 14155730

(51) Int. Cl.
*G01R 31/08* (2006.01)
*H02H 7/26* (2006.01)
(Continued)

(52) U.S. Cl.
CPC .......... *G01R 31/086* (2013.01); *H02H 7/268* (2013.01); *H02H 9/02* (2013.01); *H02H 3/305* (2013.01);
(Continued)

(58) Field of Classification Search
USPC .................................... 361/62–69
See application file for complete search history.

(56) References Cited

U.S. PATENT DOCUMENTS

| | | |
|---|---|---|
| 8,067,942 B2 | 11/2011 | Pan et al. |
| 2012/0201059 A1 | 8/2012 | Berggren |
| 2014/0002943 A1* | 1/2014 | Berggren ............... H02H 7/268 |
| | | 361/93.9 |

FOREIGN PATENT DOCUMENTS

| | | |
|---|---|---|
| CN | 101741074 A | 6/2010 |
| CN | 102237668 A | 11/2011 |

(Continued)

OTHER PUBLICATIONS

International Search Report in corresponding application PCT/EP2015/053409.

(Continued)

*Primary Examiner* — Danny Nguyen
(74) *Attorney, Agent, or Firm* — Parks IP Law LLC

(57) ABSTRACT

This application relates to methods and apparatus for fault protection in a DC power transmission network or grid that aid in determining the location of a fault in the network. The method involves, in the event of a fault, controlling at least one current limiting element of the network so as to limit a fault current flowing to below a first current level which is within the expected current operating range of the network in normal operation, i.e. a safe level. The fault current is then controlled to maintain a non-zero level of fault current flow and the characteristics of the fault current flow at different parts of the network are determined by fault current detection modules. The location of the fault is then determined based on the determined characteristics.

14 Claims, 6 Drawing Sheets

(51) Int. Cl.
    *H02H 9/02*    (2006.01)
    *H02H 7/30*    (2006.01)
    *H02H 3/30*    (2006.01)

(52) U.S. Cl.
    CPC .............. *H02H 7/261* (2013.01); *H02H 7/30* (2013.01); *Y04S 10/522* (2013.01)

(56) References Cited

FOREIGN PATENT DOCUMENTS

| | | |
|---|---|---|
| CN | 104659770 A | 5/2015 |
| EP | 2 446 527 A1 | 5/2012 |
| EP | 2 669 921 A1 | 12/2013 |
| EP | 2 820 663 A1 | 1/2015 |
| WO | 2010/149200 A1 | 12/2010 |
| WO | 2011/012174 A1 | 2/2011 |
| WO | 2011/141054 A1 | 11/2011 |
| WO | 2012/116738 A1 | 9/2012 |
| WO | 2013/127462 A1 | 9/2013 |
| WO | 2013/127463 A1 | 9/2013 |

OTHER PUBLICATIONS

Hafner, J. and Jacobson, B., "Proactive Hybrid HVDC Breakers—A key innovation for reliable HVDC grids," CIGRE Symposium in the Electric Power System of the Future: Integrating Supergrids and Microgrids, pp. 1-9 (2011).

Tang, L. and OOI, B. T., "Locating and Isolating DC Faults in Multi-Terminal DC Systems," IEEE Transactions on Power Delivery, vol. 22, No. 3, pp. 1877-1884 (Jul. 2007).

Extended European Search Report and Opinion issued in connection with corresponding EP Application No. 14155730.6 dated Feb. 2, 2015.

International Preliminary Report on Patentability and Written Opinion issued in connection with corresponding PCT Application No. PCT/EP2015/053409 dated Aug. 23, 2016.

Machine Translation and First Office Action and Search issued in connection with corresponding CN Application No. 201580009633.1 dated Jul. 16, 2018.

* cited by examiner

FAULT LOCATION IN DC NETWORKS

This invention relates to methods and apparatus for identifying and/or locating faults in a DC (direct current) grid or network for transmission of electrical power, in particular to methods and apparatus for fault location and isolation in a high voltage DC (HVDC) power grid.

DC power transmission is used in a number of different applications. HVDC is particularly useful for power transmission over long distances and/or interconnecting alternating current (AC) networks that operate at different frequencies. A first station may therefore transmit electrical energy to a second station over a DC transmission line, e.g. an overhead line or subsea or buried cable. The first station may generate the DC supply by conversion from a received AC input supply. The second station then typically provides conversion back from DC to AC. Each of the first and second stations may therefore typically comprise a voltage source converter (VSC) for converting from AC to DC or vice versa.

In a practical DC power transmission network there will be a fault protection system for protecting the components of the network in the event of a DC side fault leading to an effective low impedance short circuit. Such faults can occur for a variety of reasons, such as breakdown of insulation, accidental bridging of conductors etc. and could potentially lead to high fault currents developing which could damage the components of the HVDC converters and/or other components of the transmission network.

To prevent such damage a DC transmission network may include one or more DC circuit breakers. DC circuit breakers for HVDC transmission have been developed and WO2013/127462 or WO2013/127463 are examples of suitable circuit breakers that can be employed in a DC power transmission network. In the event of a high fault current developing at that point in the network these breakers can operate quickly to drive the fault current to zero and break the circuit and so as to prevent or at least limit damage to the network components.

Additionally some designs of VSC are able to handle faults and, in the event of a fault developing, can operate to block the fault and drive the current injected into the relevant transmission line rapidly to zero. For example multi-level modular converters (MMCs) having modules based on a full-bridge topology can be used in a fault situation to extinguish the fault current. WO2011/012174 is an example of how a suitable MMC VSC can be used for fault blocking on the DC side.

Initially HVDC power transmission systems tended to be implemented for point-to-point transmission, i.e. just from the first station to the second station. Increasingly however it is being proposed to implement HVDC power transmission on a mesh-network or DC grid comprising a plurality of DC transmission paths connecting more than two voltage converters. Such DC networks are useful, for example, in applications such as electrical power generation from renewable sources such as wind farms where there may be a plurality of sources that may be geographically remote and/or for supporting existing AC transmission capabilities allowing so called smart grids able to handle energy trading requirements and multiple sources of generation.

In a DC network having multiple VSCs, with multiple connection paths between the converters, a fault protection system may be implemented with a number of fault blocking elements arranged so as to ensure that a fault on one part of the network can be isolated from the rest of the network. For example WO2012/123015 describes how, in a DC grid, multiple VSCs can be connected to DC transmission lines that may be connected together in a switchyard and that DC breakers may be provided so that a fault on one transmission line can be rapidly isolated from the rest of the network. This document also describes that the DC grid may be divided into different zones and current limiters may be used to limit the fault current flowing between zones in a fault situation whilst the fault is being cleared.

HVDC breaker technology has developed considerably and the present generation of DC breakers and/or VSCs with fault blocking capability are capable of operating very rapidly to drive the fault current to zero, possibly in a timescale of the order of a few milliseconds or faster. This fast operation can be beneficial in reducing the likelihood of any damage caused by a high fault current but it creates a challenge in allowing the control and protection system of the DC network to be able to locate the position of the fault in the network.

Embodiments of the present invention thus relate to methods and apparatus that allow for the location of a fault in a DC network to be determined.

Thus according to the present invention there is provided a method of fault location in a DC power transmission network comprising:

in the event of a fault, controlling at least one current limiting element of the network so as limit a fault current flowing to below a first current level which is within the expected current operating range of the network in normal operation;

controlling said at least one current limiting element to maintain a non-zero level of fault current flow at a level below said first current level;

determining the characteristics of said fault current flow at different parts of the network; and determining the location of the fault based on the determined characteristics of said fault current flow at different parts of the network.

Thus in response to a fault the method of the present invention applies current limiting to reduce the fault current flowing to below a first level which is within the expected current operating range of the network in normal operation. In other words the fault current is reduced to a safe level that is unlikely to cause damage to the network. However instead of the usual approach of driving the fault current to zero as quickly as possible the fault current is maintained at this low level for a period of time. By maintaining a low but non-zero current in a fault situation the characteristics of the current flow in the network during the fault condition can be used to determine information about the location of the fault.

In some embodiment determining the characteristic of the fault current flow may comprise determining a polarity or direction of fault current flow at different parts of the network. Determining the location of the fault may comprise determining a part of the network where the polarity or direction of current flow changes. Additionally or alternatively determining the characteristics of the fault current flow at different parts of the network may comprise determining differential currents at different parts of the network.

In some embodiment at least one current limiting element may be controlled to apply a predetermined modulation to said fault current. In other words the fault current may not be maintained at a constant level but a deliberate modulation may be applied, such as an AC modulation with a characteristic frequency. Determining the characteristics of the fault current flow may then comprise monitoring for the presence or absence of said predetermined modulation. A plurality of current limiting elements located at different parts of the network may each be controlled to apply a predetermined modulation with a characteristic frequency to the fault current, wherein at least some current limiting elements are controlled to apply modulations with different characteristic frequencies to one another. Determining the characteristics of the fault current flow may then comprise monitoring for the presence or absence of said different characteristic frequencies.

The non-zero level of fault current flow at a level below said first current level may be maintained for a first time window, which may have a predetermined duration or which may end when a control signal is generated indicating that the location of the fault has been determined. At the end of the first time window the at least one current limiting element may be controlled to reduce the fault current to zero.

Following determination of the location of the fault, one or more circuit breakers may be opened to disconnect the part of the network comprising the fault from the rest of the network.

In some embodiment at least one current limiting element comprises part of a voltage source converter. Additionally or alternatively at least one current limiting element may comprise a DC breaker operable in a current limiting mode.

Embodiments of the invention also relate to a fault control system. Thus in another aspect of the invention there is provided a fault control system for a DC power transmission network comprising:

at least one current limiting element located in the network, the or each current limiting element being configured to, in the event of a fault, limit a fault current flowing to below a first current level which is within the expected current operating range of the network in normal operation and maintain a non-zero level of fault current flow at a level below said first current level;

a plurality of fault current detection modules located at different parts of the network for determining the characteristics of said fault current flow; and a controller for determining the location of the fault based on the determined characteristics of said fault current flow at different parts of the network.

The fault control system of this aspect of the invention can be operated in all of the same ways as discussion above in relation to the first aspect of the invention and offers all of the same advantages.

In particular the fault current detection modules may be configured to determine a polarity or direction of fault current flow and the controller may configured to determine the location of the fault by determining a part of the network where the polarity or direction of current flow changes. In some embodiments the fault current detection modules may be configured to determine differential currents at different parts of the network.

At least one current limiting element may be configured to apply a predetermined modulation to said non-zero level of fault current flow at a level below said first current level. The fault current detection modules may be configured to monitor for the presence or absence of said predetermined modulation. The predetermined modulation may have a characteristic frequency. In some embodiments a plurality of current limiting elements at different parts of the network may be configured to apply a predetermined modulation with a characteristic frequency to the fault current, with at least some current limiting elements being configured to apply modulations with different characteristic frequencies to one another. In which case the fault current detection modules may be configured to monitor for the presence or absence of the different characteristic frequencies.

At least one current limiting element may be configured to maintain the non-zero level of fault current flow at a level below said first current level for a first time window, which may have a predetermined duration or the controller may be configured to generate a control signal when the location of the fault has been determined and the first time window ends when said control signal is generated. At the end of the first time window at least one current limiting element may be configured to reduce the fault current to zero.

The system may also comprise one or more circuit breakers and, once the location of the fault has been determined, the controller may control the one or more circuit breakers to disconnect the part of the network comprising the fault from the rest of the network.

The controller may form at least part of a fault current detection module and each fault current detection module may comprise a controller. In some embodiment however the controller may be separate to the fault current detection modules.

At least one current limiting element may comprise part of a voltage source converter and/or at least one current limiting element may comprise a DC breaker operable in a current limiting mode.

Whilst DC breakers or voltage source converters operable in a current limiting mode are known, a current limiting element which is configured to maintain a low but non-zero fault current and to apply a predetermined modulation to the fault current to aid in fault location represents a further aspect of the present invention. Thus in a further aspect of this invention there is provided a current limiting apparatus for a DC power transmission network comprising:

a plurality of series connected modules, each of said modules comprising at least one element that in a current limiting mode of operation can be selectively connected to provide current limiting;

a controller for controlling said modules, the controller being configured to:

in the event of a fault activate the current limiting mode of operation so as to limit a fault current flowing through the current limiting apparatus to below a first current level;

maintain a non-zero level of fault current flow at a level below said first current level; and selectively connect and disconnect the current limiting elements of said modules to apply a predetermined modulation to the fault current.

The predetermined modulation may have a characteristic frequency. The current limiting apparatus may comprise a DC breaker operable in current limiting mode or may comprise part of a voltage source converter.

The controller for such a current limiter may be seen as another aspect of the invention along with the method of controlling such a current limiting apparatus.

Aspects of the invention also reside in control apparatus for determining the location of a fault in a DC network. Thus in another aspect there is provided a control apparatus for fault protection in a DC power transmission network comprising: a controller configured to receive an indication of a characteristic of fault current flow during a fault condition from each of a plurality of fault current monitoring modules and determine a location of the fault in the network from said characteristics of fault current flow.

The characteristic may be a measure of current flow. The controller may determine the relative direction or polarity of fault current flow from said measure of current flow. Alternatively the controller may receive an indication of the relative direction or polarity of fault current flow from the fault current monitoring modules. In either case the controller may determine the location of the fault from said direction or polarity of current flow. Additionally or alternatively the controller may be configured to identify one or more characteristic frequencies in the fault current and use the presence and/or absence of such characteristic frequencies to determine the location of the fault.

The invention will now be described by way of example only, with reference to the accompanying drawings, of which:

Figure 1:
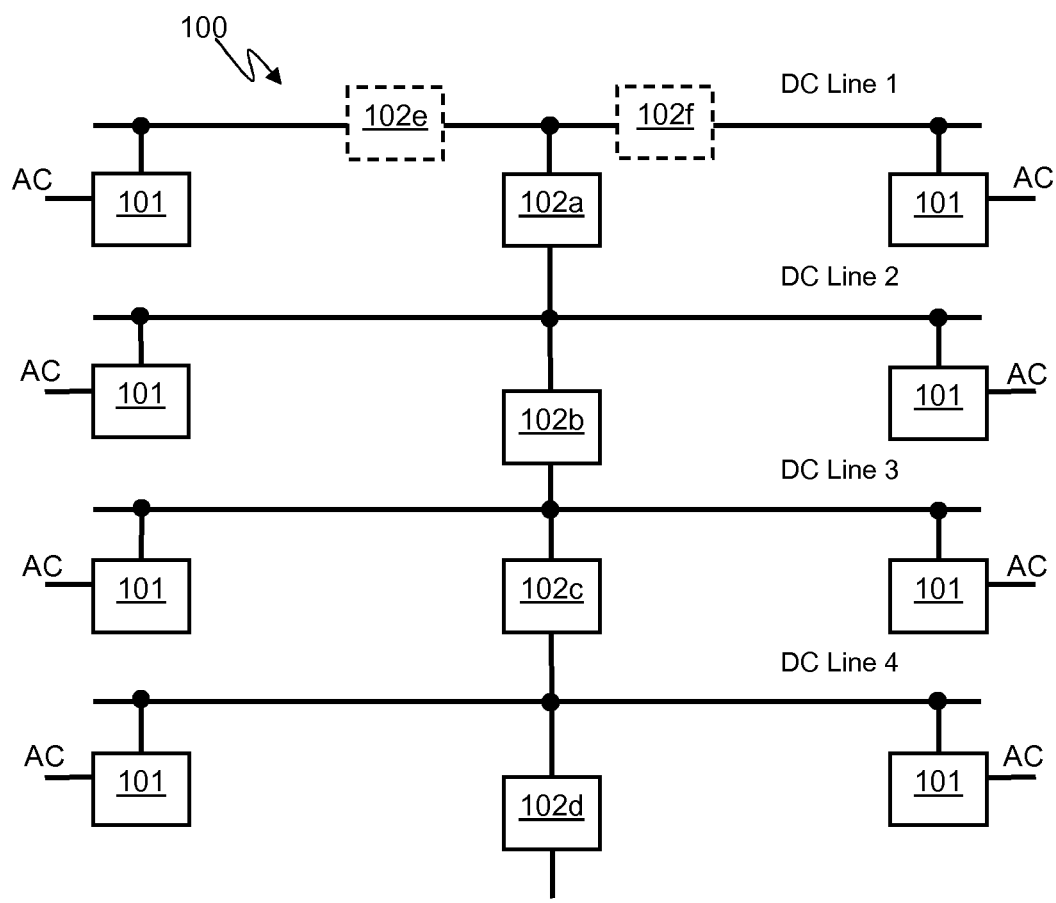
FIG. 1 illustrates one example of a DC network.

FIG. 1 illustrates one example of a DC network 100. A plurality of voltage source converters (VSCs) 101 are connected to one another via a plurality of DC transmission paths which may include transmission lines such as overhead power lines, subsea or buried cables etc. In the examples below the various transmission paths will be referred to in general as DC lines, which term shall be taken to cover any type of DC transmission path, e.g. overhead lines and subsea or buried cable for example. At least part of the DC line may also comprise transmission paths within a power station or switchyard or other part of the network. FIG. 1 illustrates an example of a radial type network in which different DC lines linking VSCs, DC lines 1-4, are connected together. It will be appreciated of course that this is just one illustrative example and the number of converters and connection paths may vary depending on the application and that many other network configurations exist.

The DC network 100 also comprises a plurality of fault protection elements for protecting the network in the event of a fault. In the example illustrated in FIG. 100 DC breakers 102a-d are located at the connections between different DC lines. In addition there may also be fault protection elements associated with each DC line. For instance the VSCs 101 may have fault blocking capability, for example they could be of the full-bridge MMC type which are able to drive the current to zero in a fault situation or include a fault module for current limiting, and/or additional DC breakers 102e-f could be provided on a given DC line.

In the event of a fault in the DC network which presents an effective short circuit to ground on one of the DC lines say, the current flow in at least part of the network would rise, which would lead to activation of the fault protection elements in that part of the network. The conventional approach in HVDC networks is to clear the fault as quickly as possible by driving the fault current, i.e. the current that flows in a fault situation, to zero, so that damage at the fault site can be minimised. However, the fault protection elements described previously, e.g. full bridge MMCs and DC breakers, are capable of extinguishing DC fault currents in just a few milliseconds. It has been appreciated by the present inventors that the conventional approach of clearing the fault as quickly as possible can pose problems for the fault protection system of a DC grid in trying to establish where the fault is (i.e., on which section of line or cable) so that the affected portion of the grid can be isolated and the remaining healthy parts restored to operation. In essence the present generation of DC circuit breakers or fault blocking converters operate so quickly that the control and protection system has very little time to deduce where the fault is located before the circuit breakers interrupt the fault current and, in doing so, effectively destroy the evidence.

Embodiments of the present invention therefore make use of fault protection elements that can provide current limiting in a fault situation. On detection of a fault the fault protection elements provide rapid current limiting to limit the fault current to a low, but non-zero, level which is low enough such that any damaging effects of the fault current are reduced or eliminated but which has a detectable characteristic that can be monitored to allow the fault location to be detected. The fault current may be limited to be below a first predetermined current level which is within the normal operating current range of the network. Thus by ensuring that the fault current is below the first level it will be constrained to a level which should not cause any damage to the network components. In some embodiments the first current level may itself be a relatively low current level, e.g. below the expected current level in normal operation and thus the fault current may be controlled to have a low level, lower than in normal operation of network. The level of the fault current is however controlled to be high enough to be detectable.

Fault current detection modules within the DC network may then monitor the characteristics of the current-limited fault current at different parts of the network to determine the location of the fault in the network, at least to within various zones defined by the fault current detection modules. Once the fault location has been determined the fault current can then be driven to zero and the affected part of the network disconnected from the rest of the network. If possible normal operation can then be restarted for the healthy part of the network.

Figure 2:
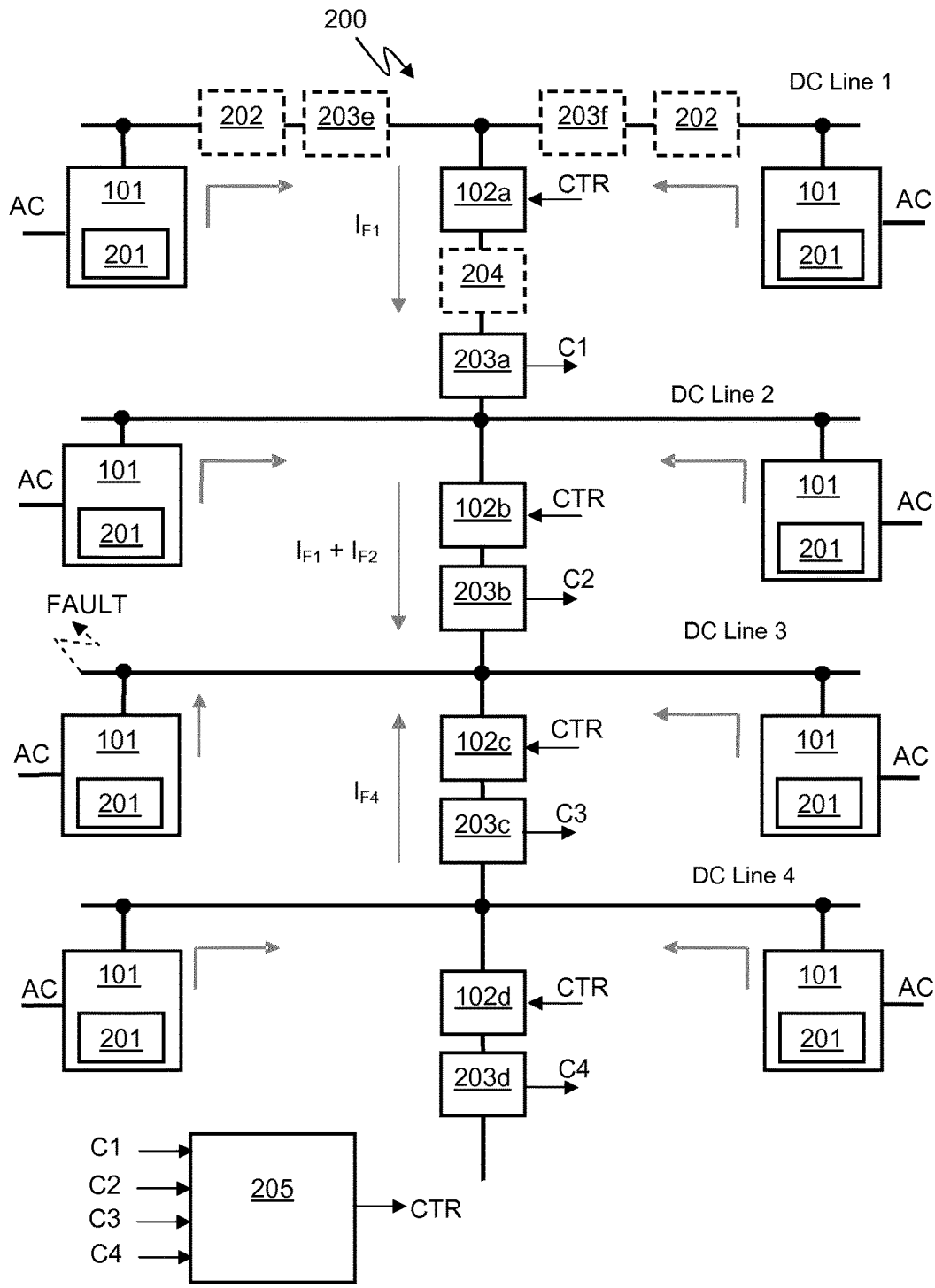
FIG. 2 illustrates an embodiment of a fault protection system implemented in a DC network.

FIG. 2 illustrates one example of a DC network 200 according to an embodiment of the present invention. FIG. 2 again shows a radial type network similar to that shown in FIG. 1. Again however it will be appreciated that other network configurations could be implemented and it will be understood that the principles of the present invention are generally applicable to any DC network.

The DC lines of the DC network are again connected to one another by DC breakers 102a-d. In this embodiment however the breakers are only fully operated to completely disconnect, i.e. break, the relevant circuit connection after the location of the fault has been determined and only those breakers necessary to disconnect the faulty part of the network may be fully operated to break the circuit. To allow for determination of the fault current the DC network comprises current limiting elements for applying current limiting in a fault situation and fault current detection modules for determining, from the characteristics of the limited fault current, the location of the fault.

In the embodiment illustrated in FIG. 2 each of the VSCs 101 is provided with a fault current limiting system 201. As mentioned above VSCs with current limiting capability are known. One example of a suitable fault module for a VSC is described in WO2011/012174, the contents of which is incorporated herein by reference although it will be appreciated that other designs could also be used. Thus the current limiting systems 201 of the VSCs 101, which may for instance comprise a fault module and/or relevant control systems of the VSCs, are able to control the fault current to limit the fault current in a fault situation. The VSCs can be controlled to drive a fault current down to a low but non-zero level and then limit the current at a desired level for a period of time. The current limiting systems 201 of the VSCs may therefore be configured to allow a characteristic fault current to flow to allow fault location to be performed before driving the fault current to zero. This means that the relevant DC breakers 102*a-d* can be operated to break the circuit only in the locations necessary to isolate the faulty part of the network.

In some embodiments in addition to or instead of controlling the fault current using the VSCs there may be current limiting elements 202, which may for instance be DC breakers operable in a current limiting mode, on the DC lines. DC breakers which can also be operated in a current limiting mode are known. Examples of suitable DC breakers that could be employed are described in WO2013/127462 or WO2012/127463, the contents of which are hereby incorporated by reference thereto. Again other designs of DC breaker are known and could be used. Such DC breakers can be operated to control the fault current injected into the network from the VSCs and be operated to control the fault current in a similar fashion as described.

In some embodiments the DC breakers 102*a-d* between the DC lines may also be capable of providing current limiting.

Whilst the DC breakers such as described in WO2013/127462 or WO2012/127463 can be used both as a full DC breaker and can also be used in a current limiting mode and thus fulfil both functions, in some embodiments if desired a separate current limiting element may be provided in series with at least one of the DC breakers. For example a current limiting element 204 may be provided in series with breaker 102*a*. The current limiting element may be provided just to provide current limiting and may not also function as a full DC breaker. In such embodiments, if the current limiting element 204 can provide all the necessary current limiting it may be possible to use a DC breaker 102*a* without current limiting functionality. Alternatively the DC breaker 102*a* may be able to provide some current limiting functionality with the additional current limiting element 204 providing additional current limiting, for instance for allowing modulation of the limited fault current.

Also provided in the network are fault current detection modules 203*a-d*. In this embodiment the fault current detection modules are associated with DC breakers 102*a-d*. In general it is the location of DC breakers in the network that are able to disconnect parts of the network that defines the granularity in terms of fault location that is required. Thus there may be fault current detection modules associated with the DC breakers. Thus if additional DC breakers 202 are present there may be associated fault current detection elements 203. In some instances however it may be desired to have additional fault current detection elements 203, for instance for monitoring the fault current controlled by the VSCs 101 as this may aid, for instance, in narrowing down on which section of a DC line the fault occurs.

The fault current detection modules monitor the characteristics of the fault current and a controller determines information about the location of the fault. In some embodiments the fault current detection modules 203*a-d* may be configured to communicate with at least their neighbouring fault current detection modules and control their respective DC breakers 102*a-d* based on a detection of the characteristics of the fault current. In other words a controller for determining the fault location, at least in relation to a given fault current detection module, may be implemented in one or more of the modules themselves. In some embodiments however a fault protection control system 205, including a suitable controller, may be arranged to communicate with at least some of the fault current detection modules 203*a-d*.

Figure 3:
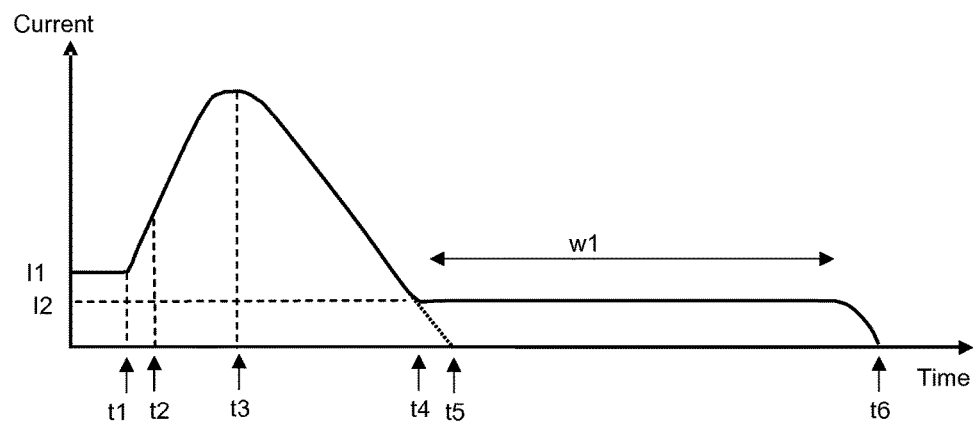
FIG. 3 illustrates one embodiment of how the fault current can be controlled.

FIG. 3 illustrates how the fault current can be controlled during a fault situation. FIG. 3 illustrates the current against time at a given location in the DC network, e.g. a current controlled by a current limiting element. Initially, before a time t1, the DC network is operating normally and the current is at a normal operating level l1. It will of course be appreciated that in practice the normal operating current may vary within certain expected limits but for simplicity of explanation it will be taken that there is a relatively constant steady-state current. At time t1 a fault develops in the network which leads to an increase in current flow. At a point t2 this current has become high enough to indicate a fault and cause the current limiting elements to operate, for example a command may be generated within the control circuitry associated with a current limiting DC breaker to open the breaker and start current limiting or to limit the current injected by the VSC. The current limiting element will take a short while to respond and thus the fault current will continue to rise. At t3 however the current limiting element starts to reduce the fault current and thus the current at time t3 therefore represents the peak fault current. The current limiting elements therefore cause the fault current to reduce until a current level l2 is reached at time t4. In this example the limited current level l2 is lower than the normal operating current l1 which means that the stresses on the conducting parts of the system are back within normal operating limits.

As mentioned above the current limiting elements may comprise DC breakers and/or fault blocking VSCs of the type mentioned previously. The operation of the fault protection circuitry in response to a fault in the period of time between t1 and t4 may therefore be largely the same as the response of the conventional fault protection system. Thus the response of the embodiments of the invention to a fault is as fast as the conventional approach and the peak current reached at time t3 is as low as possible. However in embodiments of the present invention once the fault current has been reduced to a safe but non-zero level it is maintained at or around this level for a time window w1. In the conventional approach to fault protection the fault current would be driven to zero at time t5 as indicated by the dotted line.

The time window w1 should be long enough to allow fault current detection modules to monitor the characteristics of this 'tail' current, i.e. the fault current maintained during the time window w1. Once the location of the fault has been determined the fault current can then be driven to zero at time t6. The time window w1 may be a fixed period that is expected to be long enough for accurate fault location or the fault current may be maintained until a control signal from a fault current detection module 203 and/or a fault protection control system 205 indicates that the location of the fault has been determined.

In some embodiments the fault current detection modules 203 may be configured to perform differential current monitoring and/or directional comparison. In one embodiment the polarity, i.e. direction of the current limited fault current, i.e. the tail current, may be a characteristic which is used to determine the location of the fault.

Referring back to FIG. 2 consider that a fault develops on DC line 3 as indicated. The current limiting systems 201 of the VSCs 101 and/or the current limiting DC breakers 202 if present will act as described above to minimise the peak fault current at that part of the network and rapidly reduce the fault current to the level 12. At this point the fault current flowing to the fault may be provided by various sources in the network. The grey arrows in FIG. 2 indicate how current could flow in the network. Thus a current may flow toward the fault from DC line 1 and also from DC line 2. The current flow through fault current detection module 203b will thus comprise components of both of these currents and the direction of current flow will be from DC line 2 towards DC line 3. This may be seen as a current flow in a first direction, which will be referred to as downstream. There will also be a current flowing from DC line 4 towards DC line 3, thus the current through fault current detection element 203c can be identified as flowing in the opposite direction, i.e. an upstream current flow. Using the relative direction or polarity of current flow can thus be used to determine whether the fault is upstream or downstream of a particular DC line where the fault current detection module is located.

Each fault current detection module 203a-d may therefore determine the characteristic polarity of any current flow at that location and generate a suitable control signal C1-C4. This control signal may be passed at least to neighbouring fault current detection modules to allow and/or to a fault protection control system 205 to allow location of the fault to be detected. Once the location of the fault has been detected the fault current may be driven to zero and a control signal CTR issued to the relevant DC breakers, in this example 102b and 102c, to isolate the affected part of the network. The VSCs on DC line 3 may then be disabled whereas the VSC on the rest of the network can resume normal operation without current limiting.

In some embodiments the controlled fault current may be modulated by the current limiting elements in a characteristic way to aid in fault location detection. For instance an AC component could be modulated onto the controlled fault current. The AC component may have a characteristic frequency and current limiting elements at different parts of the network could be arranged to apply different characteristic frequencies to allow fault location determination.

Figure 4:
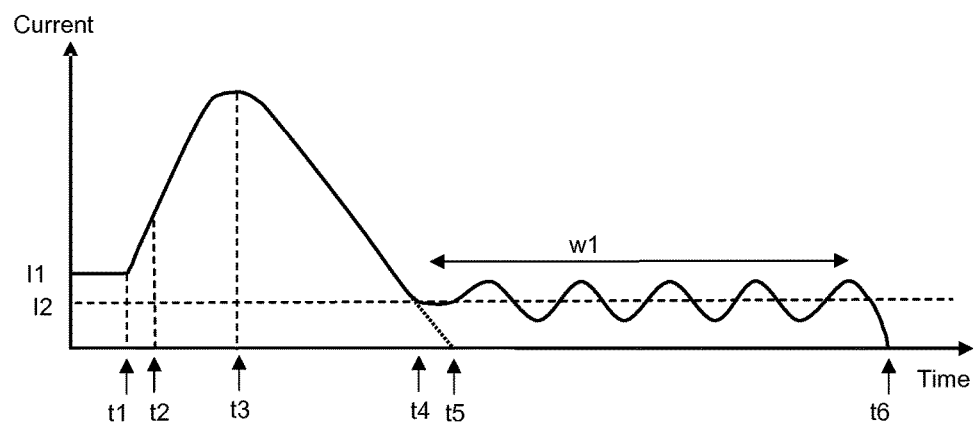
FIG. 4 illustrates another embodiment of how the fault current can be controlled.

FIG. 4 illustrates the principle of controlling the fault current over time in a fault situation to provide a characteristic AC component. FIG. 4 shows fault current against time for a given current limiting module. The initial control, between time t1 when the fault occurs and t4 when the fault current is limited to a desired safe but non-zero level, is the same as described previously. At t4 however the current limiter is controlled to vary the level of the fault current with a characteristic frequency of say a few tens of Hz. The fault current may be modulated about a DC level l2 which is below the normal operating current of the network. The maximum fault current allowed in the modulation may also in some embodiments be below the normal operating current I1. Again after the fault current location has been determined the fault current can be extinguished and the relevant DC breakers opened to isolate the affected part of the network.

As mentioned above the current limiting elements at different parts of the network may be arranged to provide different characteristic frequencies of the controlled current. Thus referring back to FIG. 2 consider that the components associated with DC line 1, e.g. current limiting elements 201 of the VSCs, introduce an AC component into the controlled current of a first frequency, say 15 Hz. The current $I_{F1}$ flowing through fault current detection module 203a will thus have a DC component and also an AC component at the first frequency. Now consider that the components associated with DC line 2 introduce an AC component into the controlled current $I_{F2}$ from that DC line of a second frequency, which is different to the first frequency, say 25 Hz. The current flowing through fault current detection module 203b will thus have a DC component and also AC component from both $I_{F1}$ and $I_{F2}$, i.e. there will be AC components at both the first and second frequencies, 15 Hz and 25 Hz. The components from the third and fourth DC lines may introduce an AC component at third and fourth characteristic frequencies respectively, say 35 Hz and 45 Hz respectively which are different from another and from the first and second frequencies. The current $I_{F4}$ through fault current detection module 203c will include a component at the fourth frequency, 45 Hz. Thus AC components at the first, second and fourth frequencies will be detected by at least one of the fault current detection modules 203a-d. However as the fault current on the third DC line flows directly to the fault a component at the third characteristic frequency, e.g. 35 Hz, will not be detected by any of the fault current detection modules 203a-d. The presence and/or absence or the characteristic frequencies may therefore be used to determine the location of the fault. Detection of the AC components may be used in addition to or instead of detection of the DC component of the controlled fault current.

The particular frequencies of the AC modulation may be chosen for a particular application, given the speed with which the current limiting element can operate to modulate the fault current. The frequencies are chosen in a range that is detectable and the lowest frequency component may be governed partly by the time required for accurate detection of such a frequency. The frequencies may also be chosen so that each characteristic frequency used at a given part of the network is unique for that part of the network and also different from the frequency difference between any two frequencies, to avoid any confusion with beat effects which may simplify the processing used.

It can therefore be seen that having a small controlled current feeding into the fault location, as opposed to effectively disconnecting the DC network from all energy sources by driving the converter current to zero, will help network fault protection devices to accurately detect the faulty element (e.g. line or bus) and trip the right circuit breakers.

The level of the low controlled fault current and frequency of any AC component should be such that it is possible to discriminate between the high-frequency oscillations ("ringing") caused by network capacitances discharging onto the fault point, and the low controlled fault current. The DC and/or AC components of the fault current may be extracted using suitable filters. For example the DC component of the fault current may be extracted using a low-pass filter arrangement and/or the AC components and their respective frequencies may be extracted using a filter arrangement comprising a high pass filter and/or one or more tuned band pass filters or a number of tuned notch filters (or a combination of these). It will be appreciated that the high pass filter may output a complex current signal containing several different frequencies. One skilled in the art will be aware of a number of well established mathematical signal processing methods available which enable the individual frequency components to be extracted, for example based on Fourier Analysis of the complex waveforms. The fault current detection modules may therefore comprise one or more filters and one or more signal processing modules for determining the AC frequencies and/or DC current levels and polarity. In some embodiments the fault current detection modules may comprise a DC Current Transformer (DCCT) for determining the AC signature frequency information and/or the direction or polarity of the DC component of the controlled fault current.

Figure 7:
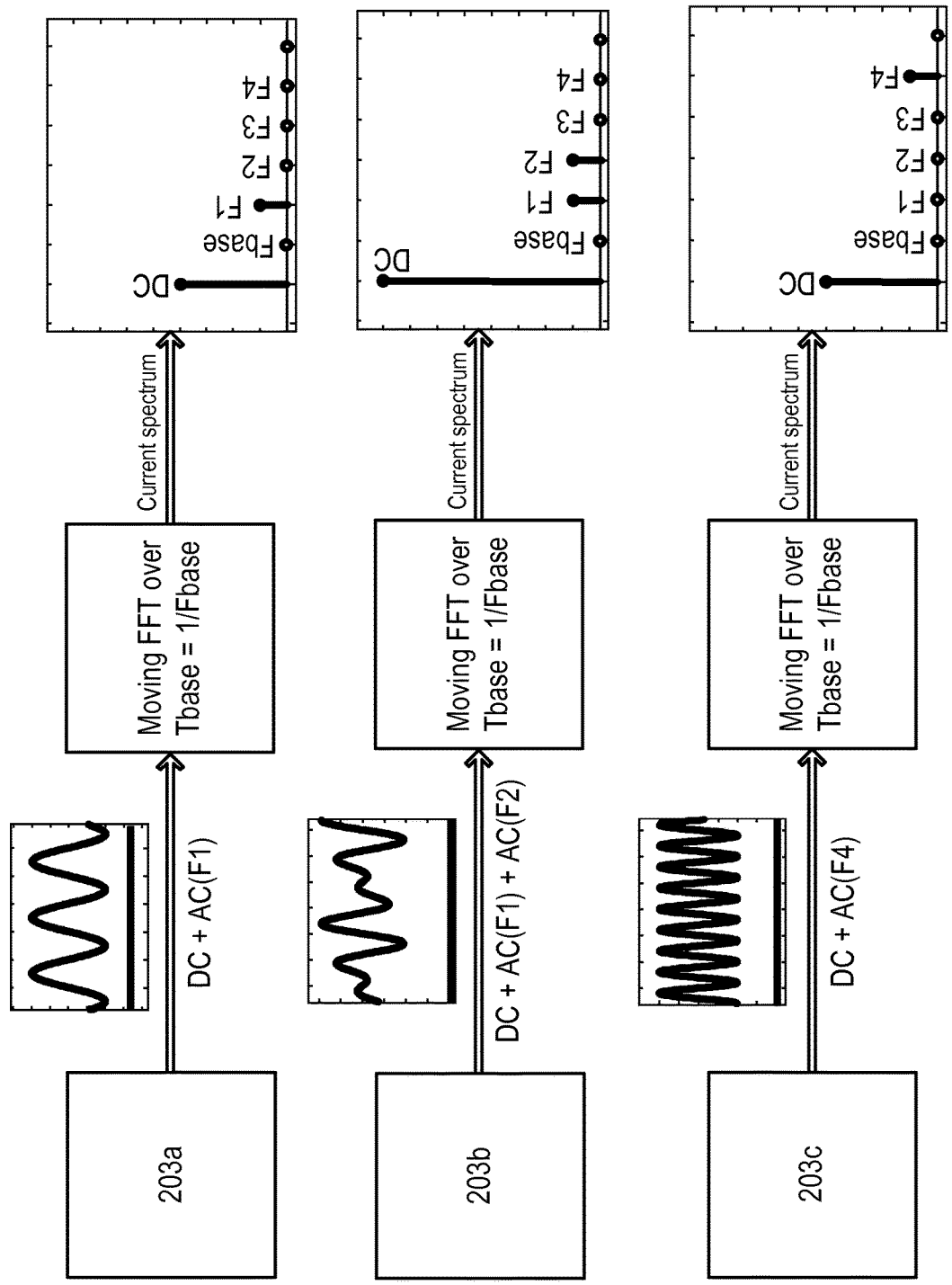
FIG. 7 illustrates how fault protection modules may apply processing to detect characteristic current frequencies.

The choice of specific signal processing techniques will be dependent on the exact values of AC frequencies used. In the simplest case, frequencies associated with every DC line will be multiples of some base frequency:

$$F_{BBn} = k_n * F_{base}$$

where $F_{BBn}$ is the frequency associated with DC line "n", $F_{base}$ is the base frequency, and $k_n$ is an integer number greater than one, which is unique for each DC line. In this case, all frequencies represent harmonics of the base frequency, and as such, are orthogonal (i.e. do not interact) over a time window $T_{base} = 1/f_{base}$. The property of orthogonality allows application of conventional spectral analysis methods, such as Fast Fourier Transform (FFT). FIG. 7 illustrates that the current signal from each of the fault protection modules 203a-c could be processed with a moving FFT over a time window equal to $T_{base} = 1/f_{base}$. FIG. 7 illustrates the resultant current spectrums that may be produced and shows that the DC component of the fault current can be also taken from the FFT output. For the example illustrated in FIG. 3 the absence of any AC component with the third characteristic frequency F3 in all of the current signals is indicative of a fault on DC line 3.

In such a processing scheme the choice of the base frequency dictates the length of the FFT window. For example, if the base frequency is 10 Hz, then the length of the FFT window will be 100 ms, which means that the fault protection modules will need at least 100 ms to detect a new steady state signal after the transition caused by a fault, i.e. it will take at least 100 ms after the fault transition to determine the location information. With a base frequency of 10 Hz say the characteristic frequencies associated with each DC line could be chosen from the range of 20 Hz, 30 Hz, 40 Hz, 50 Hz etc. Using instead a base frequency of 20 Hz, then the minimum response time for fault detection will be reduced to 50 ms following the fault, but the characteristic frequencies for each DC line would have to be spaced further apart, i.e. 40 Hz, 60 Hz, 80 Hz, 100 Hz etc. Thus the choice of base frequency may determined by considerations of speed of response in detecting the current characteristics and also any constraints on the range of characteristic frequencies that could be used.

Figure 8:
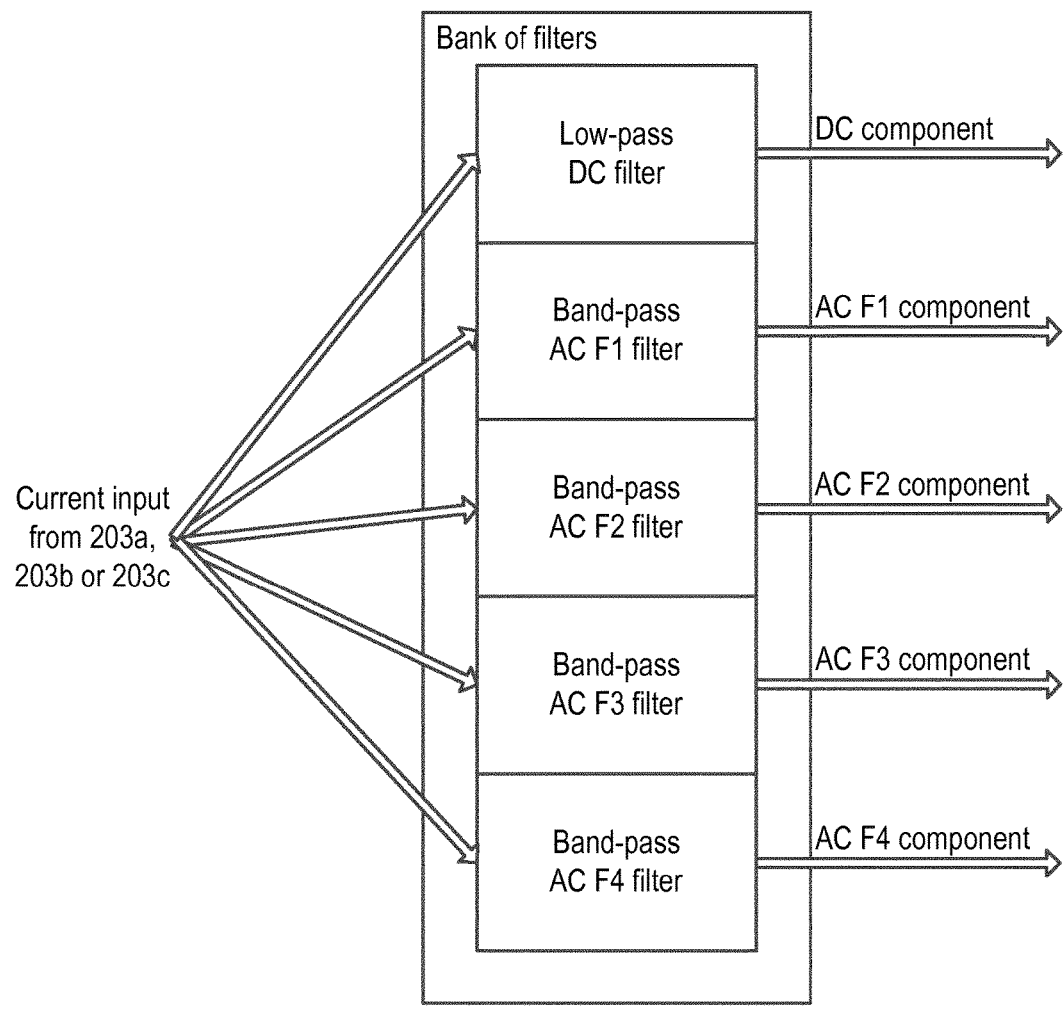
FIG. 8 illustrates a bank of filters that may be used for detecting characteristic frequencies of a fault current.

One disadvantage of choosing characteristic frequencies for each DC line as multiples of some base frequency is that so called "beat effects" may occur, whereby, for example, a combination of 30 Hz and 50 Hz signals might be seen as 40 Hz sine wave modulated by 10 Hz frequency. The presence of beat effects may not adversely impact the processing described above due to the long FFT window employed. If, however, the beat effects are not desirable because of some other considerations, the characteristic frequencies of the DC lines should be chosen such that none of them is equal to the average of any other two frequencies, for example 15 Hz, 25 Hz, 35 Hz, 45 Hz etc. For this example choice of frequencies, in order to use the same FFT technique as described above, the FFT window would be 200 ms in duration (according to base equivalent frequency of 5 Hz). In some applications such a response time for the fault protection modules to determine fault location information may be unacceptably slow. In which case, a low-pass filter, such as a FIR or IIR filter, may be used to extract the DC component of the fault current, with one or more band-pass filters, e.g. band-pass FIR or IIR filters, tuned for the specific characteristic frequencies of the DC lines, as illustrated in FIG. 8. When designing the filters, the required frequency response characteristics will be balanced with the group delay response, which to a large extent will define the response time for determining the fault location information.

In embodiments where the fault current is controlled such that the converters produce only a low-level DC fault current (i.e. without any significant AC component), this alone will facilitate the use of unit protection schemes based on the Kirchhoff's current law, for example differential protection and directional comparison schemes. Such unit protection schemes may be similar to those typically applied on AC networks.

Other, non-unit protection schemes, such as over-current and distance schemes, are known for use in AC networks. Such protection schemes, selectivity of which is based on impedance characteristics of the network, will not work well with a controlled fault current that is just a DC current. Such non-unit protection schemes would require the controlled fault current to contain some AC component, so that the inductive impedance of the transmission lines can affect voltage and current measurements. However as mentioned above the fault current can be controlled to include an AC component. Thus the combined controlled injection of low-level DC and AC faults currents allows the application of well known, tried and tested AC network protection principles to the new field of DC networks. This relies on a fault current being maintained for longer than would necessary to just clear the fault as quickly as possible. As mentioned previously the present generation of fault blocking VSCs or DC breakers can reduce a fault current to zero in a few milliseconds. This is in contrast to AC protection schemes where the best circuit breakers still take of the order of 40-60 ms to open, which allows sufficient time for sophisticated digital protective relays to deduce the location of the fault, typically by using differential current measurement.

The time required to determine the fault location in embodiments of the present invention depends on the strategy used and whether the controlled fault current is purely DC or includes some AC component. Strategies relying on just the DC component of the fault current could provide accurate discrimination within a few tens of milliseconds, for instance within about 10-20 ms. Schemes using an AC component of the fault must enable the associated frequency to be detected which requires at least half a cycle of signal (and preferably a whole cycle). Thus location discrimination could be slightly slower and for example could require of the order of 50-100 ms.

Figure 5:
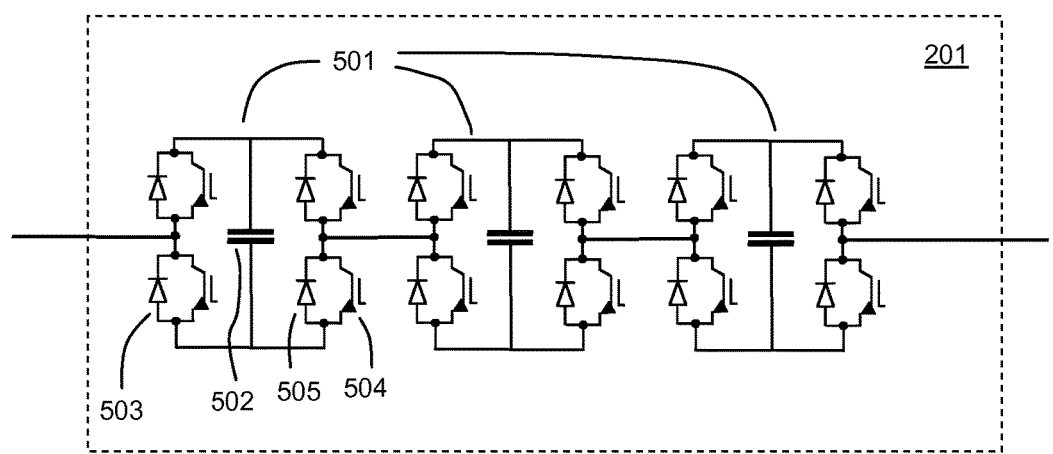
FIG. 5 illustrates the principles of a suitable current limiting apparatus that may form part of VSC.

As mentioned above at least some of the current limiting elements may be implemented with at least some of the VSCs connected to the DC network. As also mentioned above WO2011/012174 describes a suitable fault module for a VSC that can be used to provide current limiting. FIG. 5 illustrates a suitable current limiting module 201 for a VSC. The module comprises a plurality of series connected sub-modules 501 connected to form a chain link converter which may be connected within the converter between the AC and DC networks or which may comprise modules of the VSC. Three such sub-modules 501 are illustrated in FIG. 5 but there may be more modules in practice. Each sub-module 501 comprises a voltage source, which in this example is provided by a capacitor 502, connected in a full-bridge arrangement by two pairs of switches 503, each switch comprising, in this example, an insulated gate bipolar transistor (IGBT) 504 connected with an antiparallel diode 505.

The full-bridge switch arrangement allows the capacitor of each sub-module to be selectively bypassed or connected in series to provide a voltage to oppose the driving voltage of the converter to thus reduce the resulting current. The full bridge arrangement means that the fault module can reduce currents in either direction. The plurality of sub-modules each can be connected or bypassed and the individual sub-modules may be controlled to provide a varying opposing voltage, e.g. to match the AC voltage that may be driving current flow. The fault module may be a separate module of the VSC or, for a full bridge MMC VSC the modules of the MMC can be used as the fault module when required.

In embodiments of the present invention such a fault module can be controlled in the same general manner but controlled so as generate an opposing voltage that does not completely extinguish the converter current but allows the controlled fault current to flow. Also by varying the number of sub-modules connected to vary the opposing voltage in a sequence with a characteristic frequency an AC component at the characteristic frequency can be imparted to the fault current. Control of the current may, for example, be achieved by a servo controller in the converter feeding the fault. Where the fault module is effectively provided by the elements of the converter itself, i.e. full bridge modules of a MMC VSC, the DC voltage of the converter is the controlling factor. To achieve a constant DC component of fault current, the DC voltage of the converter may be controlled to zero but with a feedback term related to the difference between the measured current and a desired target current.

Figure 6:
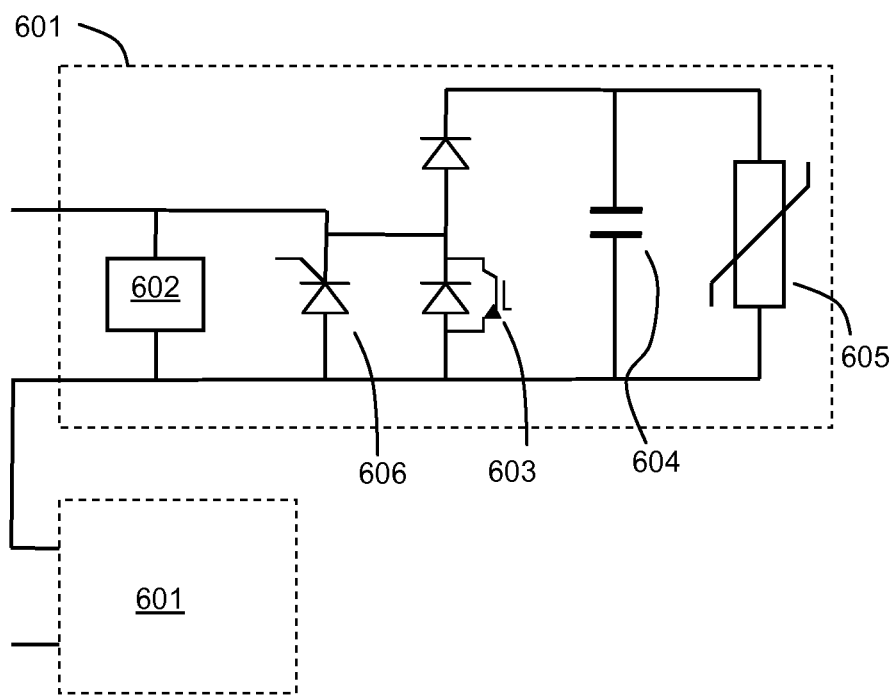
FIG. 6 illustrates the principles of a suitable DC breaker operable in a current limiting mode.

As mentioned above at least some of the current limiting elements may be implemented by DC circuit breakers operable in current limiting mode, such as described in WO2013/127462 or WO2012/127463. FIG. 6 illustrates the principles of a high voltage DC breaker operable in a current limiting mode. The DC breaker comprises a plurality of series connected modules 601. Two modules are illustrated in FIG. 6 but there may be more in practice.

The module 601 has two terminals. A mechanical switching element 602, such as a vacuum interrupter forms a first path between the two terminals. A switch 603 which comprises an IBGT with an antiparallel diode is also connected in parallel between the terminals which provides an alternative path to the mechanical switching element and which provides a means of selectively connecting or bypassing capacitor 604 and varistor 605 when the mechanical switching element is open. There may optionally also be a thyristor 606. In normal operation the mechanical switching element is closed (and the IBGT open) and the mechanical switching element provides the conduction path through the module 601. In a fault situation the IBGT is turned on and current starts to flow via the IGBT. The mechanical switch element is then triggered to open. This causes the current to fully commutate rapidly from the path including the mechanical switching element to the path including the IGBT. Once the mechanical switch element is fully open, the IGBT then is turned off, which causes capacitor 604 to charge, developing an opposing voltage to the driving voltage.

Having sufficient such modules in series an opposing voltage sufficient to prevent current flow can be developed in a similar fashion as discussed above. Control of the fault current can be achieved by selectively inserting or bypassing a variable number of the series connected DC breaker cells in response to a comparison between the measured current and a desired target current. Selectively controlling the IGBTs to connect or bypass capacitors 604 when the mechanical switch is open in a sequence can be used to modulate the fault current.

It will of course be appreciated that there are many other ways in which current limiting may be implemented in a DC breaker, or more generally in a DC network, and embodiments of the invention may be implemented with any suitable current limiting DC breakers or general current limiters.

In general therefore embodiments of the invention relate to methods and apparatus for controlling operation of a DC network for fault protection that aid in determining the location of the fault. Embodiments relate to methods of controlling a DC network, for instance a network having at a plurality of interconnected DC transmission paths for transmission of DC electrical power. The network may include voltage converters such as VSCs for regulating the DC voltage. The method involves the use of current limiting elements to limit the fault current to a safe, but non zero, level in the event of the fault and using the characteristics of the fault current to determine the location of the fault.

Embodiments also relate to a fault protection apparatus for a DC network for controlling one or more current limiting elements to limit the current in a DC network in a fault situation to a safe, but non-zero level having a characteristic to enable fault location. Such embodiments may include apparatus for applying a characteristic modulation to the controlled fault current. Embodiments also relate to apparatus for determining the characteristics of a controlled fault current to determine a fault location.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A method of fault location in a DC power transmission network comprising:
   in the event of a fault, controlling at least one current limiting element of the network to:
      limit a fault current flowing through the network to less than a first current level, wherein the first current level is within an expected current operating range of the network in normal operation; and
      maintain the fault current flowing through the network at a non-zero level;
   determining a plurality of fault currents, wherein each of the plurality of fault currents is the fault current at a different part of the network; and
   determining a location of the fault based on comparing at least two of the plurality of fault currents to one another.

2. The method of claim 1, wherein determining the plurality of fault currents comprises determining a polarity or direction of each of the plurality of fault currents.

3. The method of claim 2, wherein determining the location of the fault comprises determining a part of the network where the polarity or direction of one of the plurality of fault currents changes with respect to the polarity or direction of another of the plurality of fault currents.

4. The method of claim 1, wherein determining the location of the fault comprises determining a differential between at least two of the plurality of fault currents.

5. The method of claim 1, wherein the non-zero level of fault current is maintained for a first time window.

6. The method of claim 5, wherein, at the end of the first time window, the at least one current limiting element is controlled to reduce the fault current in the network to zero.

7. The method of claim 1, comprising, following the determination of the location of the fault, opening at least one circuit breaker to disconnect a part of the network comprising the fault from the rest of the network.

8. The method of claim 1, wherein the at least one current limiting element comprises a voltage source converter.

9. The method of claim 1, wherein the at least one current limiting element comprises a DC breaker operable in a current limiting mode.

10. A current limiting apparatus for a DC power transmission network comprising:
   a current limiting element that can be selectively connected and disconnected to the network, wherein, in a current limiting mode of operation, the current limiting element is selectively connected to the network to limit a current through the apparatus;
   a controller for controlling the current limiting element, the controller being configured to:
      in the event of a fault, activate the current limiting mode of operation so as to selectively connect the current limiting element to the network and limit a fault current through the current limiting apparatus to less than a first current level;
      maintain the fault current at a non-zero level; and
      selectively connect and disconnect the current limiting element to apply a predetermined modulation to the fault current.

11. A method of fault location in a DC power transmission network comprising:
   in the event of a fault, controlling a plurality of current limiting elements at first different parts of the network to:
      limit a fault current flowing through the network to less than a first current level, wherein the first current level is within an expected current operating range of the network in normal operation;
      maintain the fault current flowing through the network at a non-zero level; and
   applying a plurality of modulations to the fault current at second different parts of the network, wherein each of the plurality of modulations has a different characteristic frequency of a plurality of characteristic frequencies and each of the plurality of characteristic frequencies is associated with an associated one of the second different parts of the network;
   determining a plurality of fault currents, wherein each of the plurality of fault currents is the fault current at an associated one of third different parts of the network; and
   determining a location of the fault based on characteristic frequencies found in the plurality of fault currents.

12. The method of claim 11, comprising controlling, the plurality of current limiting elements to apply the plurality of modulations to the fault current.

13. The method of claim 11, wherein determining a location of the fault based on characteristic frequencies found in the plurality of fault currents comprises monitoring for a presence or absence of the plurality of characteristic frequencies.

14. The method of claim 11, wherein the first different parts of the network are the same as the second different parts of the network.

* * * * *